United States Patent
Cheng

(10) Patent No.: US 11,699,586 B2
(45) Date of Patent: Jul. 11, 2023

(54) METHOD OF MANUFACTURING NITRIDE SEMICONDUCTOR SUBSTRATE

(71) Applicant: Enkris Semiconductor, Inc., Suzhou (CN)

(72) Inventor: Kai Cheng, Suzhou (CN)

(73) Assignee: ENKRIS SEMICONDUCTOR, INC., Suzhou (CN)

(*) Notice: Subject to any disclaimer, the term of this patent is extended or adjusted under 35 U.S.C. 154(b) by 531 days.

(21) Appl. No.: 17/044,417

(22) PCT Filed: Aug. 13, 2019

(86) PCT No.: PCT/CN2019/100334
§ 371 (c)(1),
(2) Date: Oct. 1, 2020

(87) PCT Pub. No.: WO2021/026751
PCT Pub. Date: Feb. 18, 2021

(65) Prior Publication Data
US 2022/0344154 A1 Oct. 27, 2022

(51) Int. Cl.
*H01L 21/02* (2006.01)
*H01L 21/311* (2006.01)
*H01L 21/324* (2006.01)

(52) U.S. Cl.
CPC .... *H01L 21/02389* (2013.01); *H01L 21/0243* (2013.01); *H01L 21/31111* (2013.01);
(Continued)

(58) Field of Classification Search
None
See application file for complete search history.

(56) References Cited

U.S. PATENT DOCUMENTS

| 7,173,289 B1 | 2/2007 | Wu et al. |
| 9,935,175 B1 * | 4/2018 | Lee ............... H01L 21/02458 |

(Continued)

FOREIGN PATENT DOCUMENTS

| CN | 1607683 A | 4/2005 |
| CN | 1959933 | 5/2007 |

(Continued)

OTHER PUBLICATIONS

International Search Report and Written Opinion in International Appln. No. PCT/CN2019/100334, dated Apr. 28, 2020, 14 pages (with English translation).

*Primary Examiner* — Alexander G Ghyka
(74) *Attorney, Agent, or Firm* — The Small Patent Law Group LLC; Christopher R. Carroll

(57) ABSTRACT

A method of manufacturing nitride semiconductor substrate, comprising: providing silicon-on-insulator substrate which comprises an underlying silicon layer, a buried silicon dioxide layer and a top silicon layer; forming a first nitride semiconductor layer on the top silicon layer; forming, in the first nitride semiconductor layer, a plurality of notches which expose the top silicon layer; removing the top silicon layer and forming a plurality of protrusions and a plurality of recesses on an upper surface of the buried silicon dioxide layer, wherein each of the plurality of protrusions is in contact with the first nitride semiconductor layer, and there is a gap between each of the plurality of recesses and the first nitride semiconductor layer; and epitaxially growing a second nitride semiconductor layer on the first nitride semiconductor layer, such that the first nitride semiconductor layer and the second nitride semiconductor layer form a nitride semiconductor substrate.

20 Claims, 4 Drawing Sheets

(52) U.S. Cl.
CPC .... *H01L 21/3247* (2013.01); *H01L 21/02381* (2013.01); *H01L 21/02414* (2013.01)

(56) References Cited

U.S. PATENT DOCUMENTS

| | | | | |
|---|---|---|---|---|
| 2005/0077512 | A1* | 4/2005 | Yoon | H01L 33/007 |
| | | | | 257/E21.127 |
| 2009/0191695 | A1* | 7/2009 | Park | H01L 21/02513 |
| | | | | 438/483 |
| 2013/0285115 | A1* | 10/2013 | Wei | H01L 21/02513 |
| | | | | 257/190 |
| 2014/0065742 | A1* | 3/2014 | Wei | H01L 21/02546 |
| | | | | 438/29 |
| 2017/0358443 | A1* | 12/2017 | Tak | H01L 21/0251 |
| 2018/0212085 | A1 | 7/2018 | Clara et al. | |

FOREIGN PATENT DOCUMENTS

| | | |
|---|---|---|
| CN | 102263178 | 11/2011 |
| CN | 103033880 A | 4/2013 |
| CN | 103682016 A | 3/2014 |
| CN | 104752312 | 7/2015 |
| CN | 105513945 | 4/2016 |
| CN | 105895575 | 8/2016 |

\* cited by examiner

METHOD OF MANUFACTURING NITRIDE SEMICONDUCTOR SUBSTRATE

CROSS-REFERENCE TO RELATED APPLICATIONS

The present application is a U.S. national phase application under 35 U.S.C. § 371 of International Application No. PCT/CN2019/100334, entitled "METHOD OF MANUFACTURING NITRIDE SEMICONDUCTOR SUBSTRATE" and filed on Aug. 13, 2019.

TECHNICAL FIELD

This present disclosure relates to a method of manufacturing nitride semiconductor substrate.

BACKGROUND

More and more attentions are paid to III-nitride semiconductor (represented by gallium nitride (GaN)) substrates, because III-nitride semiconductor substrates can be widely applied in light emitting diodes (LED) for semiconductor lighting, high-power electric and electronic devices and radio frequency devices. Due to lack of intrinsic substrates, GaN devices are typically fabricated on heterogeneous substrates, such as sapphire substrates, silicon carbide substrate, and silicon substrate. Due to its wide applicability, the size and quality of the silicon substrates are the best among the substrates as mentioned above. The current mainstream technology of complementary metal oxide semiconductor (CMOS) is based on a 12-inch silicon substrate, while silicon is incomparable in terms of price with respect to other materials. Therefore, the best way to reduce the cost of gallium nitride-based devices may be preparing a gallium nitride semiconductor substrate on a large-size silicon substrate.

However, due to great lattice mismatch and great thermal mismatch between gallium nitride and silicon, a relatively large stress will be introduced during the processes of preparing and cooling. The stress will cause defects in the epitaxially grown gallium nitride semiconductor substrate, and warping and cracking will occur. Additionally, it is impossible to manufacture a large-size gallium nitride semiconductor substrate.

SUMMARY

In order to achieve the above purpose, at least one embodiments of the present disclosure provides a method of manufacturing nitride semiconductor substrate, which includes:

providing a silicon-on-insulator substrate, which includes: an underlying silicon layer, a buried silicon dioxide layer, and a top silicon layer;

forming a first nitride semiconductor layer on the top silicon layer;

forming, in the first nitride semiconductor layer, a plurality of notches which expose the top silicon layer;

removing the top silicon layer and forming a plurality of protrusions and a plurality of recesses on an upper surface of the buried silicon dioxide layer, wherein each of the plurality of protrusions is in contact with the first nitride semiconductor layer, and there is a gap between each of the plurality of recesses and the first nitride semiconductor layers;

epitaxially growing a second nitride semiconductor layer on the first nitride semiconductor layer, such that the first nitride semiconductor layer and the second nitride semiconductor layer form a nitride semiconductor substrate.

In some embodiments of the present disclosure, the method further includes: removing the underlying silicon layer and the buried silicon dioxide layer, such that the first nitride semiconductor layer and the second nitride semiconductor layer form a self-supporting nitride semiconductor substrate.

In some embodiments of the present disclosure, the manufacturing method further includes: forming, before epitaxially growing the second nitride semiconductor layer on the first nitride semiconductor layer, a nitride buffer layer on the first nitride semiconductor layer, such that the first nitride semiconductor layer, the nitride buffer layer and the second nitride semiconductor layer form the nitride semiconductor substrate.

In some embodiments of the present disclosure, the manufacturing method further includes: removing the underlying silicon layer and the buried silicon dioxide layer, such that the first nitride semiconductor layer, the nitride buffer layer and the second nitride semiconductor layer form a self-supporting nitride semiconductor substrate.

In some embodiments of the present disclosure, removing the underlying silicon layer and the buried silicon dioxide layer makes the self-supporting nitride semiconductor substrate separate from the underlying silicon layer and the buried silicon dioxide layer.

In some embodiments of the present disclosure, the buried silicon dioxide layer is etched by HF acid solution so as to separate the self-supporting nitride semiconductor substrate from the underlying silicon layer.

In some embodiments of the present disclosure, the top silicon layer is thinned to 20 Å~200 Å before forming the first nitride semiconductor layer on the top silicon layer.

In some embodiments of the present disclosure, material for the first nitride semiconductor layer includes AlN.

In some embodiments of the present disclosure, a thickness of the first nitride semiconductor layer ranges from 20 Å to 5000 Å.

In some embodiments of the present disclosure, the plurality of notches are formed in the first nitride semiconductor layer through annealing.

In some embodiments of the present disclosure, process conditions for the annealing comprise: an atmosphere of hydrogen and ammonia.

In some embodiments of the present disclosure, opening ratio of the plurality of notches in the first nitride semiconductor layer is 0.1%-30%.

In some embodiments of the present disclosure, removing the top silicon layer and forming the plurality of protrusions and the plurality of recesses on the upper surface of the buried silicon dioxide layer includes: the top silicon layer and a part of the buried silicon dioxide layer reacting chemically with each other to generate gaseous silicon monoxide which is discharged in form of gas.

In some embodiments of the present disclosure, process conditions for removing the top silicon layer include ambient atmosphere comprising hydrogen.

In some embodiments of the present disclosure, material for the second nitride semiconductor layer includes AlN or GaN.

In some embodiments of the present disclosure, material for the nitride buffer layer includes at least one of AlN, GaN, AlGaN, and AlInGaN.

In some embodiments of the present disclosure, a thickness of the nitride semiconductor substrate ranges from 0.1 μm to 500 μm.

Compared with the prior art, the present disclosure has the following beneficial effects:

1) First, the first nitride semiconductor layer is formed on the silicon-on-insulator substrate, so that a plurality of notches that expose the top silicon layer are formed in the first nitride semiconductor layer; then the top silicon layer is removed, and the plurality of protrusions and the plurality of recesses are formed on the upper surface of the buried silicon dioxide layer of the silicon-on-insulator substrate, wherein each of the plurality of protrusions is in contact with the first nitride semiconductor layer, and there is a gap between each of the plurality of recesses and the first nitride semiconductor layers; and then, the second nitride semiconductor layer is epitaxially grown on the first nitride semiconductor layer, such that the first nitride semiconductor layer and the second nitride semiconductor layer form a nitride semiconductor substrate. The top silicon layer is removed, such that the first nitride semiconductor layer directly contacts the buried silicon dioxide layer; by removing the top silicon layer, a structure with low electrical resistivity (typically, the electrical resistivity of silicon is less than 10000 Ω·cm) is removed. In a case that the nitride semiconductor substrate is applied in a radio frequency device, it can greatly reduce the radio frequency loss of the radio frequency device. Through the point contacts and partial suspension structures between the buried silicon dioxide layer and the first nitride semiconductor layer, the stress mismatch during the epitaxial growth of the second nitride semiconductor layer is alleviated. Thus, a large-size nitride semiconductor substrate with less defects can be manufactured. And further, it is also facilitated to peel the underlying silicon layer during manufacturing the self-supporting nitride semiconductor substrate.

2) In an alternative solution, before epitaxially growing the second nitride semiconductor layer on the first nitride semiconductor layer, a nitride buffer layer is formed on the first nitride semiconductor layer, such that the first nitride semiconductor layer, the nitride buffer layer and the second nitride semiconductor layer form the nitride semiconductor substrate. The nitride buffer layer can further alleviate lattice mismatch in the epitaxial growth of the second nitride semiconductor layer, and the manufactured nitride semiconductor substrate has fewer defects.

3) In an optional solution, the underlying silicon layer and the buried silicon dioxide layer are removed, such that the first nitride semiconductor layer and the second nitride semiconductor layer form a self-supporting nitride semiconductor substrate. For the optional solution 2), after removing the underlying silicon layer and the buried silicon dioxide layer, the first nitride semiconductor layer, the nitride buffer layer and the second nitride semiconductor layer form a self-supporting nitride semiconductor substrate. In other words, the underlying silicon layer and the buried silicon dioxide layer in the silicon-on-insulator substrate can be transferred and used as a whole with the nitride semiconductor substrate, or, the nitride semiconductor substrate can be transferred and used alone after removing the underlying silicon layer and the buried silicon dioxide layer.

4) In an optional solution, for the optional solution 3), removing the underlying silicon layer and the buried silicon dioxide layer makes the self-supporting nitride semiconductor substrate separate from the underlying silicon layer and the buried silicon dioxide layer. In other optional solutions, the underlying silicon layer and the buried silicon dioxide layer are also removed through wet etching or chemical mechanical polishing. Compared with the latter scheme, the underlying silicon layer in the former scheme can also be used for other purposes.

5) In an optional solution, removing the top silicon layer and forming a plurality of protrusions and a plurality of recesses on the upper surface of the buried silicon dioxide layer includes: the top silicon layer and part of the buried silicon dioxide layer chemically reacting with each other to form gaseous silicon monoxide, which is discharged in form of gas. Silicon monoxide can be discharged through the plurality of notches in the first nitride semiconductor layer and/or the gap between the recesses and the first nitride semiconductor layer. In other alternative solutions, it is also possible to remove the top silicon layer and part of the buried silicon dioxide layer through wet etching solutions such as HF acid mixed HNA/SCl/TMMA or dry etching gases such as $CF_4$ and $C_3F_8$ passing through the plurality of notches in the first nitride semiconductor layer. Compared with the latter solution, the former solution can be carried out at a lower cost, and can be carried out in an epitaxial furnace, and has good compatibility with the previous and subsequent processing steps.

6) In an optional solution, a plurality of notches are formed in the first nitride semiconductor layer through annealing. The high temperature and cooling make lattice mismatch between the first nitride semiconductor layer and the top silicon layer more serious, so that a plurality of notches are formed in the first nitride semiconductor layer after annealing. In other alternatives, the formed first nitride semiconductor layer itself has a plurality of notches. Compared with the latter scheme, the former scheme is more controllable.

7) In an optional solution, material for the first nitride semiconductor layer includes AlN, and material for the second nitride semiconductor layer includes AlN or GaN; or material for the first nitride semiconductor layer includes AlN, and material for the nitride buffer layer includes AlN, GaN, AlGaN, AlInGaN, and material for the second nitride semiconductor layer includes AlN or GaN.

Figure 1:
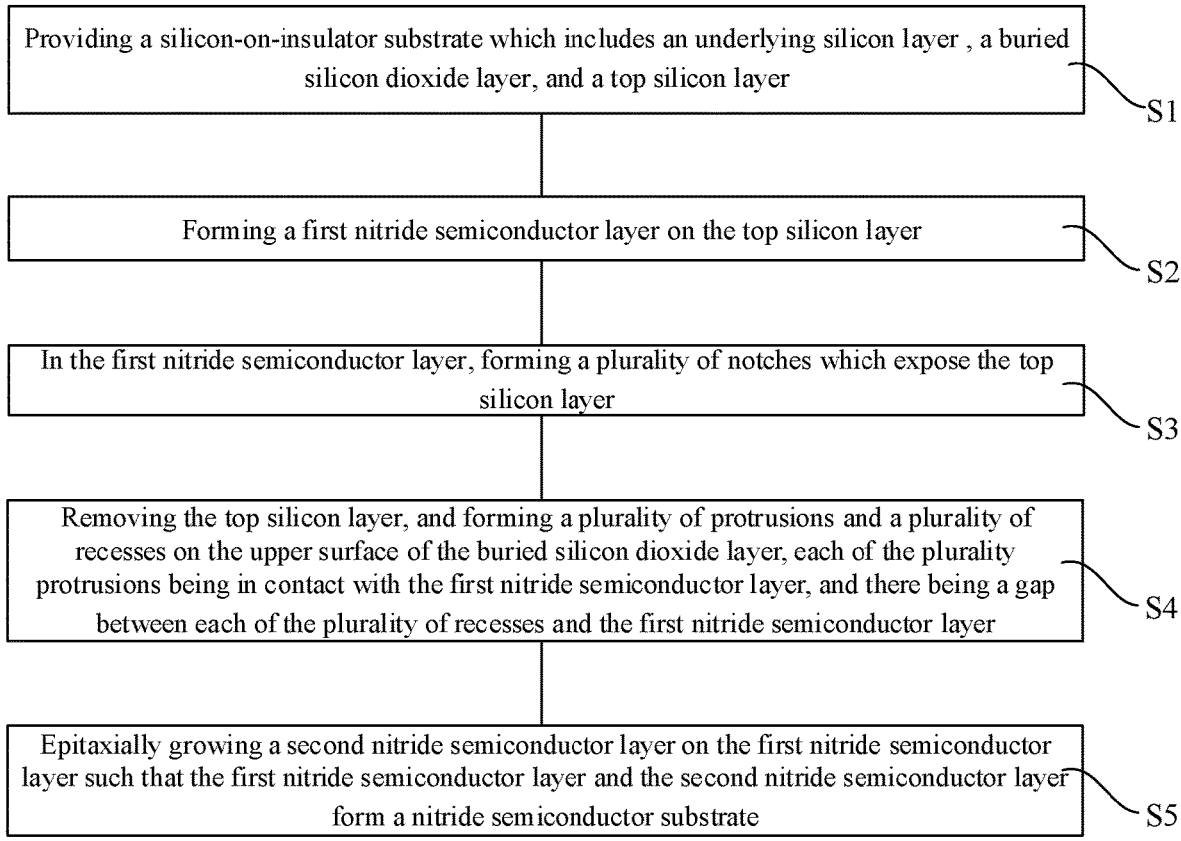
FIG. 1 is a flowchart of a method of manufacturing nitride semiconductor substrate according to a first embodiment of the present disclosure.

To facilitate the understanding of the present disclosure, all reference signs present in the present disclosure are listed below:

Silicon-on-insulator 11

Underlying silicon layer 111

Buried silicon dioxide layer 112

Top silicon layer 113
First nitride semiconductor layer 12
Notch 12a
Protrusion 112a
Recess 112b
Second nitride semiconductor layer 13
Nitride semiconductor substrate 1
Nitride buffer layer 14

DETAILED DESCRIPTION OF THE EMBODIMENTS

In order to make the above-mentioned objects, features and advantages of the present disclosure more obvious and understandable, embodiments of the present disclosure will be described in detail below with reference to the accompanying drawings.

FIG. 1 is a flowchart of a method of manufacturing nitride semiconductor substrate according to a first embodiment of the present disclosure; and FIGS. 2 to 6 are schematic views illustrating intermediate structures corresponding to the process of FIG. 1.

Figure 2:
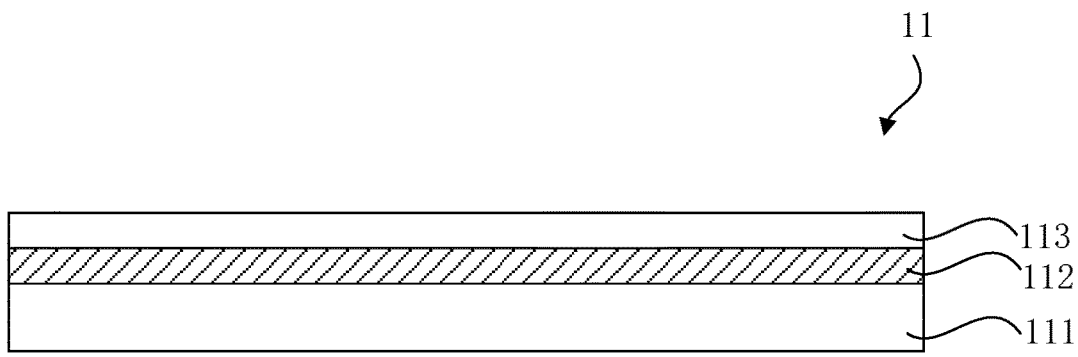
FIGS. 2 to 6 are schematic views illustrating intermediate structures corresponding to the process of FIG. 1.

Step S1: As illustrated in FIG. 2, a silicon-on-insulator substrate 11 is provided. The silicon-on-insulator substrate 11 includes an underlying silicon layer 111, a buried silicon dioxide layer 112, and a top silicon layer 113.

The silicon-on-insulator substrate 11 may be a standard SOI substrate, where the crystal plane of the top silicon layer 113 can be (111), and a thickness of the top silicon layer 113 ranges from 50 Å to 3000 Å; a thickness of the buried silicon dioxide layer 112 ranges from 100 Å~30000 Å.

In this step S1, the thickness of the top layer silicon 113 can be reduced to 20 Å to 200 Å through a thinning process. In an embodiment of the present disclosure, the thickness of the top layer silicon 113 can be reduced to 50 Å to 100 Å.

The thinning process may include: a) wet etching, wet etching liquid for which is, for example, HNA (HF, Nitric acid, Acetic acid), SC1 ($NH_4OH$, $H_2O_2$, $H_2O$), TMAH (Tetramethyl Ammonium Hydroxide), and etc.; or b) dry etching, etching gas for which is, for example, HCl, $Cl_2$ and etc., and which can be achieved in-situ in the epitaxial furnace; or c) thinning after oxidation, that is, oxygen is first introduced to oxidize a top surface layer of the top silicon layer 113 into silicon dioxide, and then the silicon dioxide at the top surface layer is etched by the HF acid through wet etching; or d) chemical mechanical polishing.

Figure 3:
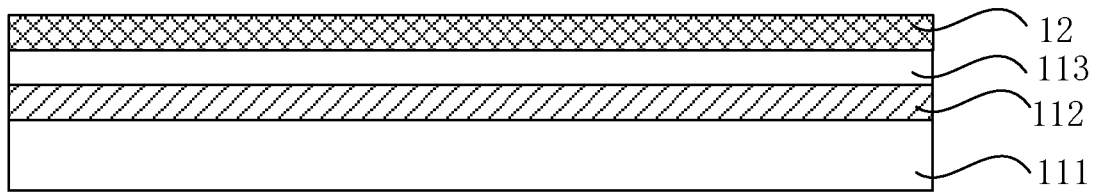

Step S2: As illustrated in FIG. 3, a first nitride semiconductor layer 12 is formed on the top silicon layer 113.

Material for the first nitride semiconductor layer 12 may include AlN, and forming process for forming the first nitride semiconductor layer 12 may include: Atomic Layer Deposition (ALD), or Chemical Vapor Deposition (CVD), or molecular beam epitaxial (MBE), or Plasma Enhanced Chemical Vapor Deposition (PECVD), or Low Pressure Chemical Vapor Deposition (LPCVD), or Metal-Organic Chemical Vapor Deposition (MOCVD), or a combination thereof. A temperature for deposition may be less than 1000° C. The deposition may be carried out in an epitaxial furnace.

Before forming the first nitride semiconductor layer 12, a surface of the top silicon layer 113 may be nitridized to form a layer of silicon nitride. This solution can mitigate the lattice mismatch between the first nitride semiconductor layer 12 and the top silicon layer 113, thereby reducing defects in the first nitride semiconductor layer 12, and improving the quality of the first nitride semiconductor layer 12.

A thickness of the first nitride semiconductor layer 12 may range from 20 Å to 5000 Å.

Figure 4:
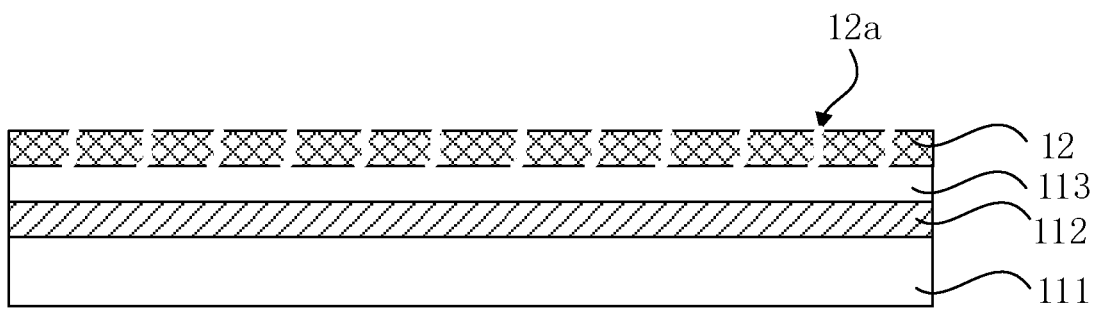

Step S3: As illustrated in FIG. 4, a plurality of notches 12a, which expose the top silicon layer 113, are formed in the first nitride semiconductor layer 12.

In this embodiment, a plurality of notches 12a are formed in the first nitride semiconductor layer 12 through annealing. High temperature and cooling make lattice mismatch and thermal mismatch between the first nitride semiconductor layer 12 and the top silicon 113 more serious, so that a plurality of notches 12a may appear in the first nitride semiconductor layer 12 after annealing.

Process conditions for the annealing may include: atmosphere of hydrogen and ammonia; temperature in a range from 1000° C. to 1200° C.; and time duration ranging from 60 s to 1200 s. In an embodiment of the present disclosure, the temperature ranges from 1000° C. to 1100° C.

In other embodiments, in the process of forming the first nitride semiconductor layer 12, a plurality of notches 12a may be introduced into the first nitride semiconductor layer. This solution can be achieved through a deposition process for the first nitride semiconductor layer 12 which increases lattice mismatch and thermal mismatch. For example, a) the nitridizing treatment on the surface of the top silicon layer 113 is omitted, and the first nitride semiconductor layer 12 is directly deposited on the top silicon layer 113, orb) the temperature for deposition is increased.

In this step S3, opening ratio of the notches 12a in the first nitride semiconductor layer 12 is, for example, 0.1%-30%.

Figure 5:
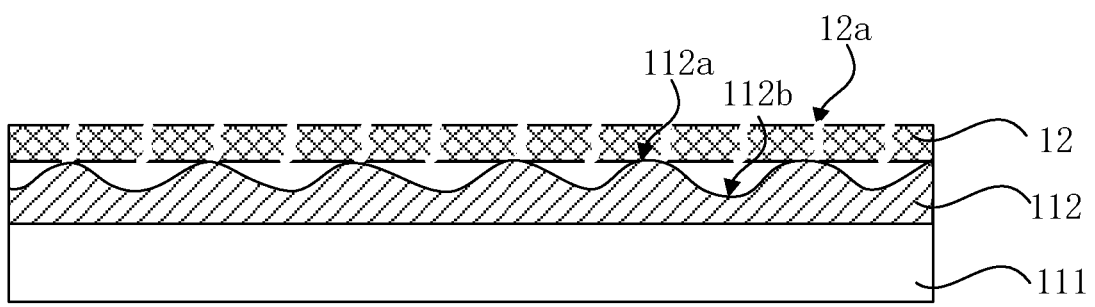

Step S4: As illustrated in FIG. 5, the top silicon layer 113 is removed, and a plurality of protrusions 112a and a plurality of recesses 112b are formed on the upper surface of the buried silicon dioxide layer 112. Each of the plurality of protrusions 112a is in contact with the first nitride semiconductor layer 12, and there is a gap between each of the plurality of recesses 112b and the first nitride semiconductor layer 12.

In the step S4, a point contact and a partial suspension structure are formed between the buried silicon dioxide layer 112 and the first nitride semiconductor layer 12.

In this embodiment, gaseous silicon monoxide can be generated by the chemical reaction between the top silicon layer 113 and part of the buried silicon dioxide layer 112. The silicon monoxide is discharged in form of gas to remove the top silicon layer 113, and a plurality of protrusions 112a and a plurality of recesses 112b are formed on the top surface of the buried silicon dioxide layer 112. Silicon monoxide can be discharged through the plurality of notches 12a in the first nitride semiconductor layer 12 and/or the gaps between the recesses 112b and the first nitride semiconductor layer 12.

The equation of the above chemical reaction may be expressed as: $Si(s) + SiO_2(s) \rightarrow 2SiO(g)$.

Exemplarily, conditions for the above chemical reaction include: environmental atmosphere of hydrogen, or of hydrogen and nitrogen, or of hydrogen and hydrogen chloride, or of hydrogen and chlorine; pressure of the atmosphere ranges from 10 Torrs to 760 Torrs, for example, from 10 Torrs to 80 Torrs; temperature ranges from 1100° C. to 1200° C.; and the time duration ranges from 60 s to 1200 s.

In other embodiments, a wet etching solution such as HF acid mixed HNA/SCl/TMAH can be dripped on the upper surface of the first nitride semiconductor layer 12. The wet etching solution enters into the plurality of notches 12a to etch away the top silicon layer 113 and a part of the buried silicon dioxide layer 112, so as to form a plurality of protrusions 112a and a plurality of recesses 112b on the top surface of the buried silicon dioxide layer 112.

In other embodiments, a patterned mask such as photoresist can further be formed on the top surface of the first nitride semiconductor layer 12, and openings in the mask expose each notch 12a; the above-mentioned semiconductor structure is first subject to anisotropic plasma drying etching, followed by isotropic plasma dry etching or wet etching to remove the top silicon layer 113 and part of the buried silicon dioxide layer 112. Etching gas for the drying etching may be, for example, $CF_4$, $C_3F_8$ and the like.

In the step S4, by removing the top layer silicon layer 113, a structure with low electrical resistivity (typically, the electrical resistivity of silicon is less than 10000 Ω·cm) is removed. When the nitride semiconductor substrate is applied in radio frequency devices, the radio frequency loss of the radio frequency devices can be greatly reduced.

Figure 6:
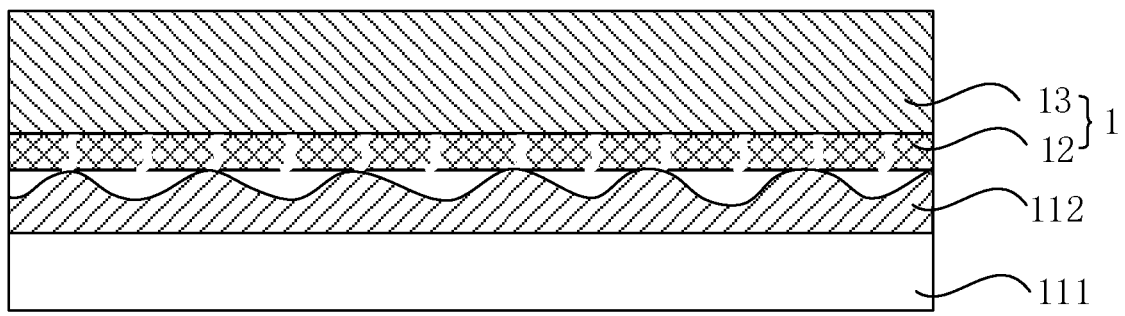

Step S5: As illustrated in FIG. 6, a second nitride semiconductor layer 13 is epitaxially grown on the first nitride semiconductor layer 12, such that the first nitride semiconductor layer 12 and the second nitride semiconductor layer 13 form a nitride semiconductor substrate 1.

It should be understood that, due to the point contact and the partial suspension structure between the buried silicon dioxide layer 112 and the first nitride semiconductor layer 12, it is beneficial for the stress, which is generated during the epitaxial growth of the second nitride semiconductor layer 13, to be effectively released, so that the second nitride semiconductor layer 13 has less defects, and is flat continuously, thereby being possible to manufacture a large size substrate.

Material for the second nitride semiconductor layer 13 may be AlN or GaN.

Exemplarily, the epitaxial growth process of the step S5 is carried out in an epitaxial furnace at a temperature of 1100° C. to 1200° C.

A thickness of the finally formed nitride semiconductor substrate 1 may range from 0.1 µm to 50 µm.

Figure 7:
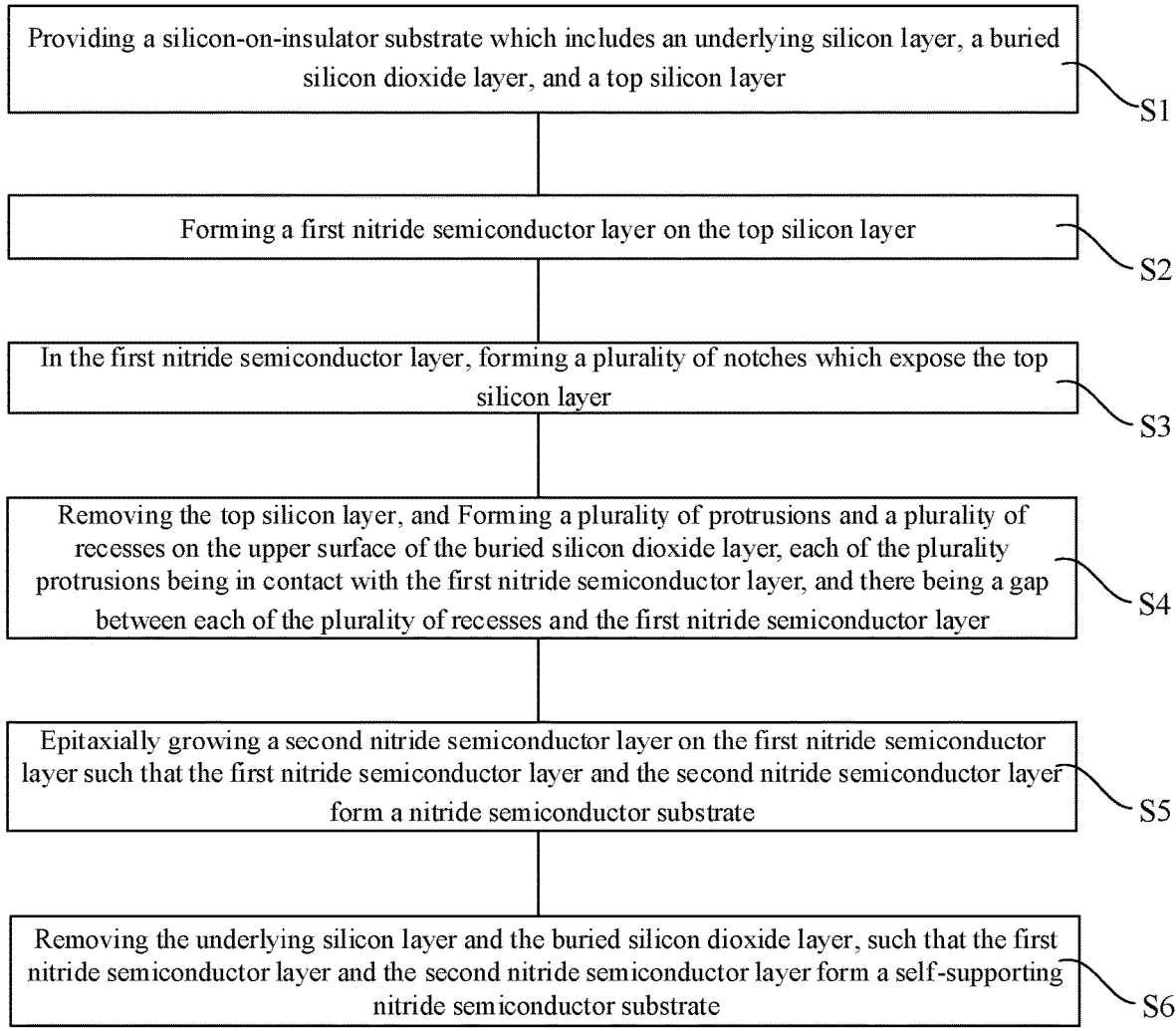
FIG. 7 is a flowchart of a method of manufacturing nitride semiconductor substrate according to a second embodiment of the present disclosure.
Figure 8:
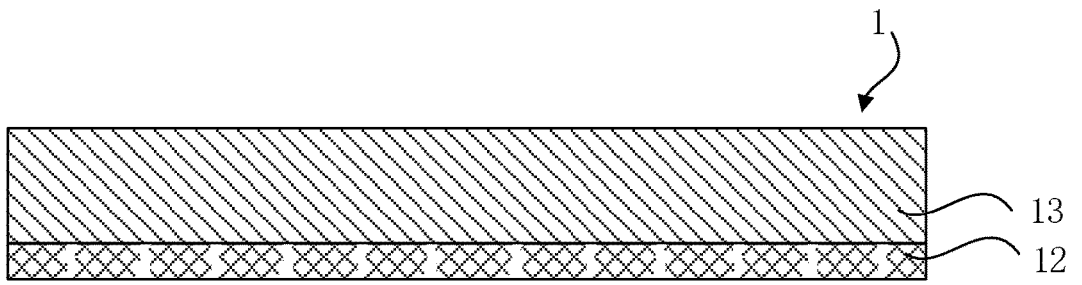
FIG. 8 is a schematic view illustrating an intermediate structure corresponding to the process of FIG. 7.

FIG. 7 is a flowchart of a method of manufacturing nitride semiconductor substrate according to a second embodiment of the present disclosure; FIG. 8 is a schematic view illustrating an intermediate structure corresponding to the processes in FIG. 7.

Referring to FIGS. 7, 8 and 1, the method of manufacturing nitride semiconductor substrate according to the second embodiment is substantially the same as the method of manufacturing nitride semiconductor substrate according to the first embodiment, except that the method according to the second embodiment further includes step S6, in which the underlying silicon layer 111 and the buried silicon dioxide layer 112 are removed and the first nitride semiconductor layer 12 along with the second nitride semiconductor layer 13 form a self-supporting nitride semiconductor substrate 1.

That is: in the first embodiment, the underlying silicon layer 111 and the buried silicon dioxide layer 112 in the silicon-on-insulator substrate 11 and the nitride semiconductor substrate 1 are transferred and used as a whole; while in the second embodiment, the nitride semiconductor substrate 1 is transferred and used alone.

In this embodiment, removing the underlying silicon layer 111 and the buried silicon dioxide layer 112 can separate the self-supporting nitride semiconductor substrate 1 from the underlying silicon layer 111 and the buried silicon dioxide layer 112. In embodiments of the present disclosure, the underlying silicon layer 111 and the buried silicon dioxide layer 112 can be removed through the following manners: a) the buried silicon dioxide layer 112 is etched by an HF acid solution so as to separate the self-supporting nitride semiconductor substrate 1 from the underlying silicon layer 111. It can be understood that, on one hand, due to thermal mismatch between the first nitride semiconductor layer 12 and the top silicon layer 113, there is tensile stress in the first nitride semiconductor layer 12, which is beneficial for the first nitride semiconductor layer 12 to be separated from the underlying silicon layer 111 on its own, and on the other hand, the first nitride semiconductor layer 12 contacts with the buried silicon dioxide layer 112 in a point contact manner, and there are partial suspension structures between first nitride semiconductor layer 12 and the buried silicon dioxide layer 112, which further facilitates the first nitride semiconductor layer 12 to be separated from the underlying silicon layer 111 on its own. Or, b) peeling the underlying silicon layer 111 and the buried silicon dioxide layer 112 through a laser.

In other embodiments, the underlying silicon layer 111 and the buried silicon dioxide layer 112 can also be removed by wet etching or chemical mechanical polishing.

When removing the underlying silicon layer 111 and the buried silicon dioxide layer 112, a protection layer may further be provided on the second nitride semiconductor layer 13 to guarantee the safety and the stability of the self-supporting nitride semiconductor substrate 1 during the separation. Material for the protection layer may be PMMA (polymethacrylate) or other polymer materials. After that, the self-supporting nitride semiconductor substrate 1 is transferred to another carrier for storage.

Figure 9:
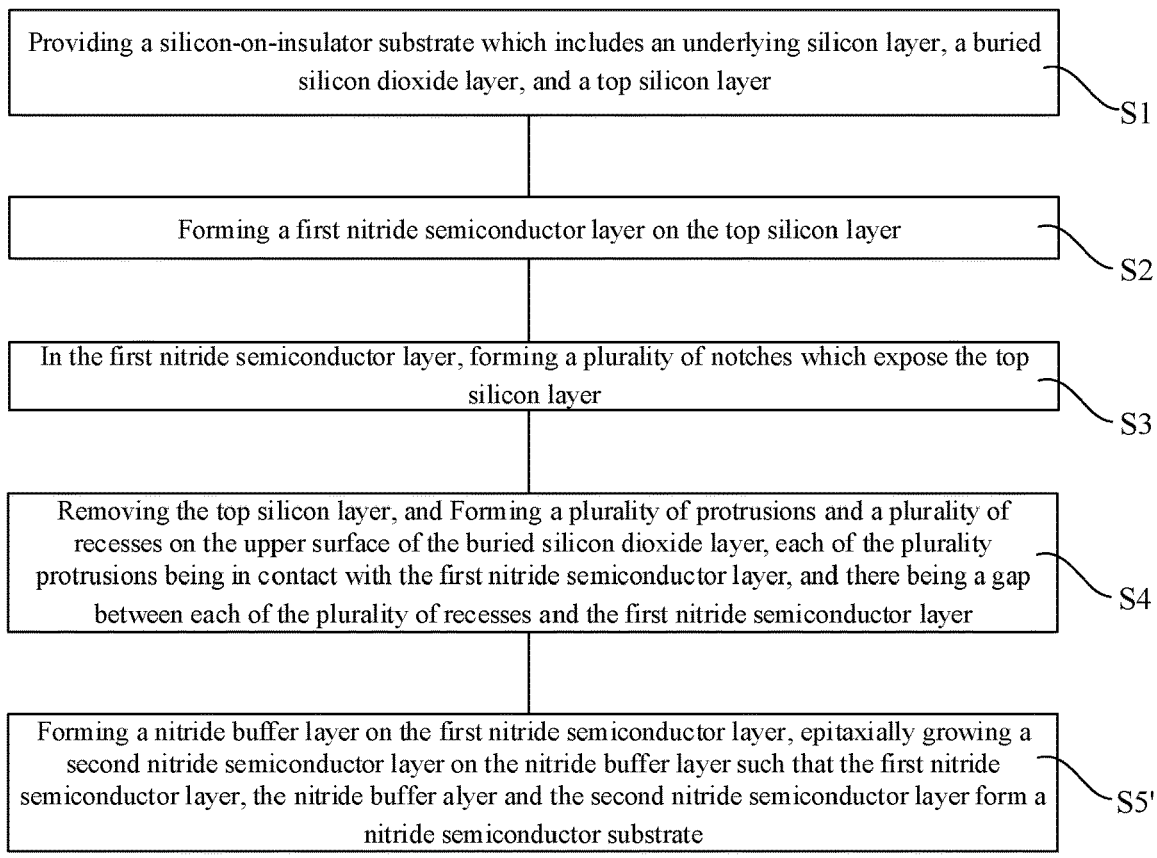
FIG. 9 is a flowchart of a method of manufacturing nitride semiconductor substrate according to a third embodiment of the present disclosure.
Figure 10:
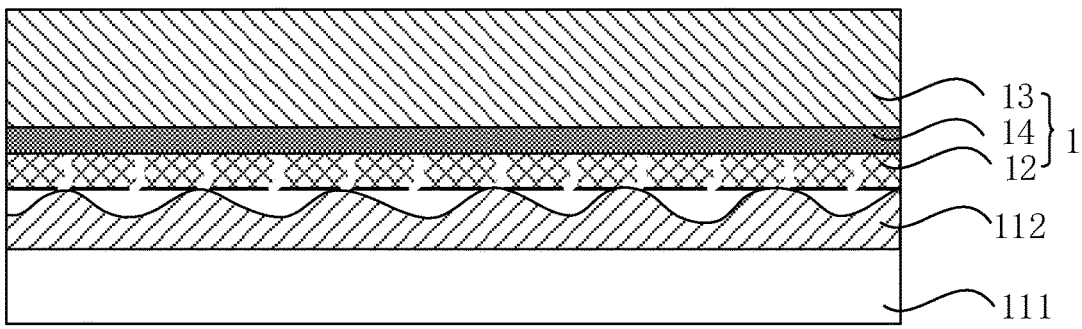
FIG. 10 is a schematic view illustrating an intermediate structure corresponding to the process of FIG. 9.

FIG. 9 is a flow chart of a method of manufacturing nitride semiconductor substrate according to a third embodiment of the present disclosure; FIG. 10 is a schematic view of an intermediate structure corresponding to the processes in FIG. 9. Referring to FIG. 9, FIG. 10 and FIG. 1, the method of manufacturing nitride semiconductor substrate according to the third embodiment is substantially the same as the method of manufacturing nitride semiconductor substrate according to the first embodiment, except that: in step S5', a nitride buffer layer 14 is formed on the first nitride semiconductor layer 12, and a second nitride semiconductor layer 13 is epitaxially grown on the nitride buffer layer 14. Thus, the first nitride semiconductor layer 12, the nitride buffer layer 14 and the second nitride semiconductor layer 13 together form the nitride semiconductor substrate 1.

Material for the nitride buffer layer 14 may include AlN, GaN, AlGaN, AlInGaN, and the method for forming the nitride buffer layer may include: Atomic Layer Deposition (ALD), or Chemical Vapor Deposition (CVD), or Molecular Beam Epitaxial growth method (MBE), or Plasma Enhanced Chemical Vapor Deposition (PECVD), or Low Pressure Chemical Vapor Deposition (LPCVD), or Metal-Organic Chemical Vapor Deposition (MOCVD), or a combination thereof.

Exemplarily, material for the first nitride semiconductor layer 12 is AlN, material for the nitride buffer layer 14 may be at least one of AlN, GaN, AlGaN or AlInGaN, and material for the second nitride semiconductor layer 13 is GaN.

Studies show that arrangement of the nitride buffer layer 14 can reduce the threading dislocation (TD) density in the second nitride semiconductor layer 13 and TD bending due to the lateral growth mechanism. For example, the TD density can be reduced to 1e6 $cm^2$ or less.

Figure 11:
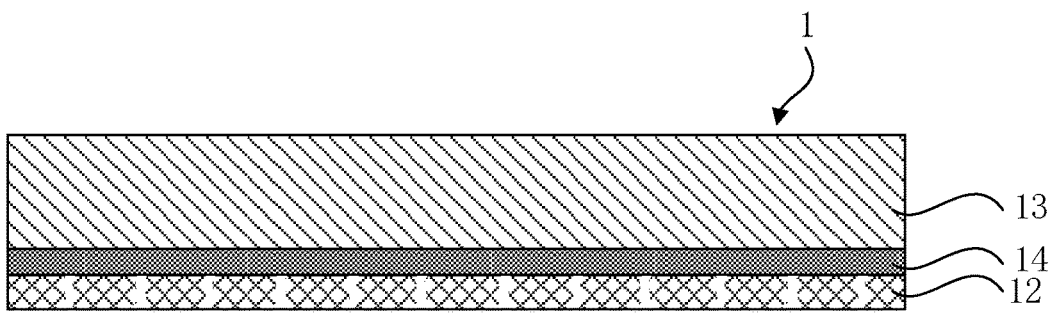
FIG. 11 is a schematic view illustrating an intermediate structure corresponding to the method of manufacturing nitride semiconductor substrate according to the fourth embodiment of the present disclosure.

FIG. 11 is a schematic view of an intermediate structure corresponding to the method of manufacturing nitride semiconductor substrate according to the fourth embodiment of the present invention. Referring to FIG. 10 and FIG. 11, the method of manufacturing nitride semiconductor substrate according to the fourth embodiment is substantially the same as the method of manufacturing nitride semiconductor substrate according to the third embodiment, except that: it further includes removing the underlying silicon layer 111 and the buried silicon dioxide layer 112, such that the first nitride semiconductor layer 12, the nitride buffer layer 14, and the second nitride semiconductor layer 13 together form the self-supporting nitride semiconductor substrate 1.

The removing manner for the underlying silicon layer 111 and the buried silicon dioxide layer 112 can be referred to the removing manner in the second embodiment.

Although the present disclosure discloses the above contents, the present disclosure is not limited thereto. One of ordinary skill in the art can make various variants and modifications to the present disclosure without departing from the spirit and scope of the present disclosure. Therefore, the protection scope of the present disclosure should be set forth by the appended claims.

The invention claimed is:

1. A method of manufacturing nitride semiconductor substrate, comprising:
    providing silicon-on-insulator substrate which comprises an underlying silicon layer, a buried silicon dioxide layer and a top silicon layer;
    forming a first nitride semiconductor layer on the top silicon layer;
    forming, in the first nitride semiconductor layer, a plurality of notches which expose the top silicon layer;
    removing the top silicon layer and forming a plurality of protrusions and a plurality of recesses on an upper surface of the buried silicon dioxide layer, wherein each of the plurality of protrusions is in contact with the first nitride semiconductor layer, and there is a gap between each of the plurality of recesses and the first nitride semiconductor layer; and
    epitaxially growing a second nitride semiconductor layer on the first nitride semiconductor layer, such that the first nitride semiconductor layer and the second nitride semiconductor layer form a nitride semiconductor substrate.

2. The method of manufacturing nitride semiconductor substrate according to claim 1, further comprising:
    removing the underlying silicon layer and the buried silicon dioxide layer, such that the first nitride semiconductor layer and the second nitride semiconductor layer form a self-supporting nitride semiconductor substrate.

3. The method of manufacturing nitride semiconductor substrate according to claim 1, further comprising:
    forming, before epitaxially growing the second nitride semiconductor layer on the first nitride semiconductor layer, a nitride buffer layer on the first nitride semiconductor layer, such that the first nitride semiconductor layer, the nitride buffer layer and the second nitride semiconductor layer together form the nitride semiconductor substrate.

4. The method of manufacturing nitride semiconductor substrate according to claim 3, further comprising:
    removing the underlying silicon layer and the buried silicon dioxide layer, such that the first nitride semiconductor layer, the nitride buffer layer and the second nitride semiconductor layer form a self-supporting nitride semiconductor substrate.

5. The method of manufacturing nitride semiconductor substrate according to claim 2, wherein removing the underlying silicon layer and the buried silicon dioxide layer makes the self-supporting nitride semiconductor substrate separate from the underlying silicon layer and the buried silicon dioxide layer.

6. The method of manufacturing nitride semiconductor substrate according to claim 5, wherein the buried silicon dioxide layer is etched by HF acid solution so as to separate the self-supporting nitride semiconductor substrate from the underlying silicon layer.

7. The method of manufacturing nitride semiconductor substrate according to claim 1, wherein the top silicon layer is thinned to 20 Å-200 Å before forming the first nitride semiconductor layer on the top silicon layer.

8. The method of manufacturing nitride semiconductor substrate according to claim 1, wherein material for the first nitride semiconductor layer comprises AlN.

9. The method of manufacturing nitride semiconductor substrate according to claim 1, wherein a thickness of the first nitride semiconductor layer ranges from 20 Å to 5000 Å.

10. The method of manufacturing nitride semiconductor substrate according to claim 1, wherein the plurality of notches are formed in the first nitride semiconductor layer through annealing.

11. The method of manufacturing nitride semiconductor substrate according to claim 10, wherein process conditions for the annealing comprise: an atmosphere of hydrogen and ammonia.

12. The method of manufacturing nitride semiconductor substrate according to claim 1, wherein opening ratio of the plurality of notches in the first nitride semiconductor layer is 0.1%-30%.

13. The method of manufacturing nitride semiconductor substrate according to claim 1, wherein removing the top silicon layer and forming the plurality of protrusions and the plurality of recesses on the upper surface of the buried silicon dioxide layer comprises:
    the top silicon layer and a part of the buried silicon dioxide layer reacting chemically with each other so as to generate gaseous silicon monoxide which is discharged in form of gas.

14. The method of manufacturing nitride semiconductor substrate according to claim 13, wherein process conditions for removing the top silicon layer comprises: ambient atmosphere comprising hydrogen.

15. The method of manufacturing nitride semiconductor substrate according to claim 1, wherein material for the second nitride semiconductor layer (13) comprises AlN or GaN.

16. The method of manufacturing nitride semiconductor substrate according to claim 3, wherein material for the nitride buffer layer comprises at least one of AlN, GaN, AlGaN, and AlInGaN.

17. The method of manufacturing nitride semiconductor substrate according to claim 15, wherein a thickness of the nitride semiconductor substrate ranges from 0.1 μm to 50 μm.

18. The method of manufacturing nitride semiconductor substrate according to claim 4, wherein removing the underlying silicon layer and the buried silicon dioxide layer makes the self-supporting nitride semiconductor substrate separate from the underlying silicon layer and the buried silicon dioxide layer.

19. The method of manufacturing nitride semiconductor substrate according to claim 8, wherein a thickness of the first nitride semiconductor layer ranges from 20 Å to 5000 Å.

20. The method of manufacturing nitride semiconductor substrate according to claim 10, wherein opening ratio of the plurality of notches in the first nitride semiconductor layer is 0.1%-30%.

* * * * *